US005546046A

United States Patent [19]
Trentino

[11] Patent Number: 5,546,046
[45] Date of Patent: Aug. 13, 1996

[54] OUTPUT TUBE BIAS SELECTION APPARATUS FOR TONE ALTERATION IN A TUBE-TYPE AUDIO AMPLIFIER

[76] Inventor: Salvatore J. Trentino, 800 Sir Francis Drake Blvd. Suite A, San Anselmo, Calif. 94960

[21] Appl. No.: 371,022

[22] Filed: Jan. 9, 1995

[51] Int. Cl.[6] ........................................................ H03F 3/28
[52] U.S. Cl. ............................................ 330/127; 330/123
[58] Field of Search .................................... 330/118, 123, 330/127, 128, 134; 381/120

[56] References Cited

U.S. PATENT DOCUMENTS 2,797,315   6/1957   Holst ........................................ 330/127

*Primary Examiner*—Steven Mottola
*Attorney, Agent, or Firm*—Larry D. Johnson

[57] ABSTRACT

A tonal altering feature for a tube type guitar audio amplifier provides apparatus enabling the selection of the method of output tube bias.

2 Claims, 1 Drawing Sheet

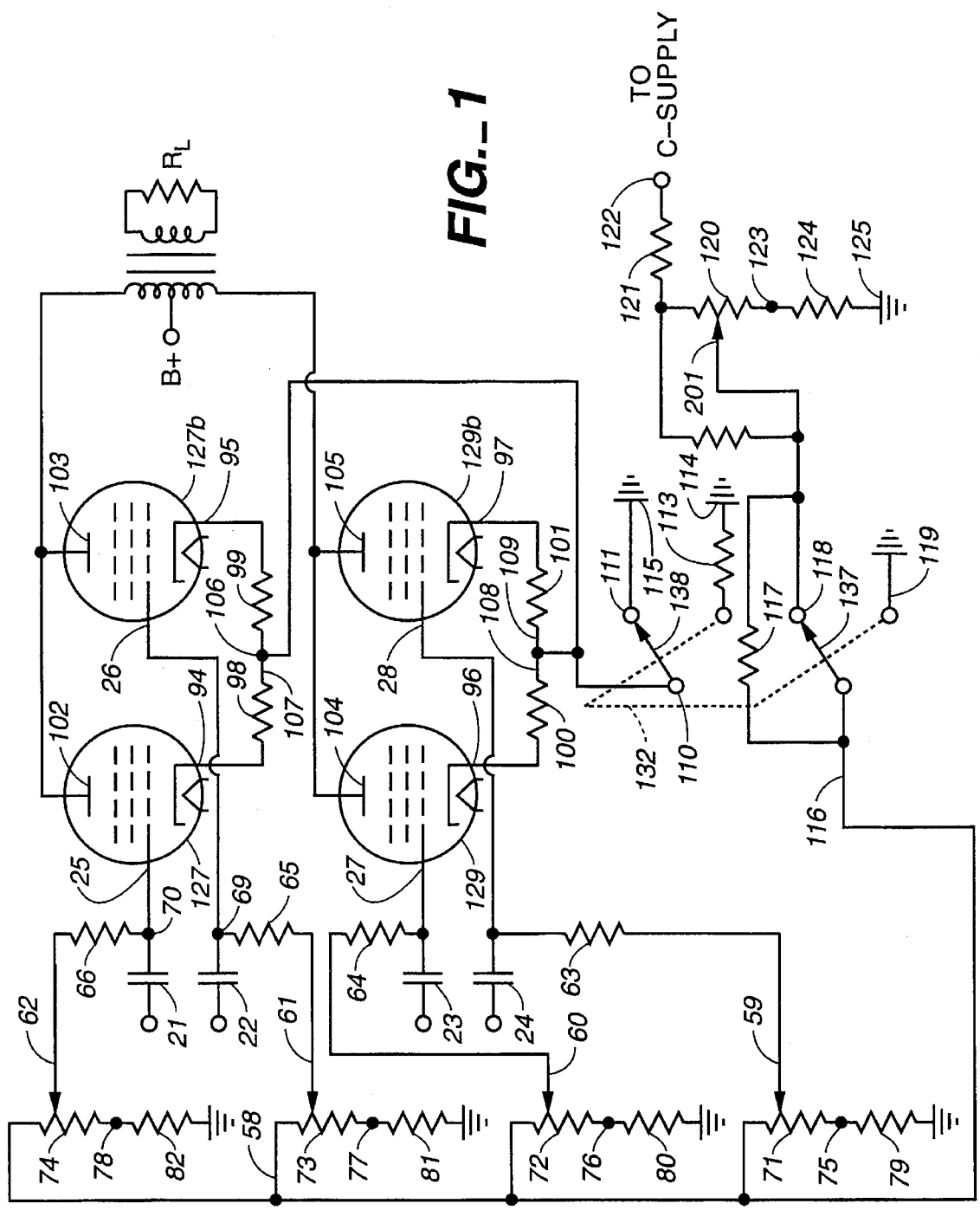
FIG._1

OUTPUT TUBE BIAS SELECTION APPARATUS FOR TONE ALTERATION IN A TUBE-TYPE AUDIO AMPLIFIER

This application is related to co-pending applications Ser. No. 08/371,023 for a PHASE INVERTER SELECTION APPARATUS FOR TONE ALTERATION IN A TUBE-TYPE AUDIO AMPLIFIER, and Ser. No. 08/371,021 for an OUTPUT POWER SELECTION APPARATUS FOR A TUBE-TYPE AUDIO AMPLIFIER, filed concurrently herewith by applicant herein.

BACKGROUND OF THE INVENTION

1. Field of the Invention

This invention relates generally to tube-type audio amplifiers, and more specifically to an output tube bias selection apparatus enabling tone alteration of the output signal.

2. Description of the Prior Art

Tube type audio amplifiers, especially tube type guitar amplifiers, have had their output tube stages configured as class A (single ended or push pull, with no grid current); class AB1 (push pull with no grid current); and class AB2 (with some grid current allowed during some portion of the signal drive cycle). In those push pull type output stages, pairs or multiple pairs of output tubes are employed to achieve relatively large output wattages. In all of these cases however, some means of setting up a quiescent bias level of current flowing within the output tubes is necessary to allow the tubes to operate over some useful portion of their characteristic transfer curves. This quiescent current level, when properly selected, also reduces or eliminates the crossover or notch distortion present in pure class B operation (where no quiescent current is employed).

Two basic methods of achieving this quiescent current goal have been developed. These are called methods of bias and they are: 1) fixed bias, and 2) self or cathode bias. In fixed bias, a separate C– power supply or battery is used to D.C. bias the control grid of an output tube (with respect to that tubes's cathode) at such a point that a suitable plate current flows in that tube. If we assume a constant A.C. signal drive level to the control grids of the push pull output tube, then by adjusting the voltage of this C– bias supply, that quiescent plate current may be adjusted to achieve the typical class A or class AB operation so desirable in audio output stages. In this fixed bias system, the cathodes of the output tubes are usually connected to ground (low side of the B+ supply) through a very small cathode resistor (typically less than ten ohms), or connected to ground directly. In some rare cases, designers have used fairly large cathode resistors to achieve a combination of fixed and self bias, but that is not pertinent to the instant invention.

In self or cathode bias operation, the quiescent bias current through the output tubes is achieved by holding the control grid of an output tube at D.C. ground potential and utilizing a suitable resistor in the cathode circuit of that tube connected to ground (B–). With a high D.C. potential applied to the plate (and screen grid) of that output tube, a current begins to flow through that cathode resistor (and through the output tube). This flowing current causes a voltage to appear across that cathode resistor, as predicted by Ohm's Laws. This voltage is effectively applied between the control grid and cathode of that tube. This achieves what the C– battery (or C– direct current power supply) accomplished in the fixed bias scheme described above. Since the current through the tube causes a voltage to build up across the cathode resistor and hence control the quiescent current through that tube itself, this bias method is called self or cathode bias.

In the past, tube type guitar audio amplifiers have employed either fixed bias or self bias as mentioned above. Self bias was very common in 1950's genre of tube type guitar amplifiers, while fixed bias became more common in 1960's style amplifiers, with some crossover between the two types. In one obscure example of an amplifier which used both, fixed bias was the dominant and preferred bias form, and only when the separate C– bias supply failed, did the design switch over automatically to the self bias mode. However, the type of bias selection was not user controllable, and employed a relay to do the switching between the bias methods automatically, since self bias was only used as a fail-safe measure in case of component failure. It was not used, as in the current invention, as a tonal deciding feature.

SUMMARY OF THE INVENTION

This invention provides a tonal altering feature for a tube type guitar audio amplifier in the form of circuitry enabling the selection of the method of output tube bias. The different selections will significantly vary the character and tone coloration of the amplifier in reproducing the guitar's signal, especially when the amplifier is driven into the nonlinear portions of operating parameters (as guitarists often use their amplifiers).

The inventive apparatus generally includes at least one output tube having an output tube control grid and an output tube cathode; a C– power supply; a B+ and B– power supply; and a bias switch for selectively connecting the output tube control grid to a C– power supply, and the output tube cathode to the ground of a B+ power supply for fixed bias, or alternatively selectively connecting the output tube control grid to a B– power supply, and the output tube cathode to the minus side of a B– power supply through a resistor for cathode (self) bias. In the preferred embodiment, the switch is a double pole, double throw switch having a first set of poles for the control grid connection of the output tube, and a second set of poles for the cathode connection of the output tube.

BRIEF DESCRIPTION OF THE DRAWINGS

FIG. 1 is a schematic view of output bias selection circuitry for a tube-type audio amplifier of this invention.

DETAILED DESCRIPTION OF A PREFERRED EMBODIMENT

FIG. 1 is a schematic view of the electrical operation of this bias switching, with reference to one output tube 127. In the fixed bias mode the C– supply is fed into the circuit at point 122. The plus side of this C– power supply goes to the ground 125 of the circuit. This negative voltage goes through resistor 121 and then to the top of the master bias potentiometer 120 and then through that potentiometer's wiper 201 on to pole 118 of multi-pole switch 132, which is shown in the fixed bias mode. From pole 118 the C– voltage goes to the point 116 of that switch 132 and then to the control grid 25 of the output tube 127 via bias trim pot 74, out through that trim pot's wiper 62 to bias supply resistor 66 and then to the control grid 25 of tube 127.

The C– bias paths of the other output tubes are similar. Although four output tubes are shown in FIG. 1, this invention works with single tubes, push pull pairs, and parallel push pull pairs, such as shown in FIG. 1. In the fixed bias mode, the cathodes of the tubes under consideration are connected to the ground side of the B+ supply, either directly, or through low ohm resistors, which act as current sampling devices used in monitoring the quiescent current levels during bias set up operations. In the case of the output tube 127, its cathode 94 is connected to low ohm resistor 98 through point 106 to point 110 which is the other wiper of the multi-section bias mode setting switch 132. The cathode is then connected through pole 111 to the ground side 115 of the B+ power supply. Likewise, the cathodes of the other output tubes follow a similar path through their individual sampling cathode resistors to the ground side of the B+ supply, through switch 132, just as described for tube 127.

Fixed bias has a particular tonal quality which is desirable, especially when the output tubes are over driven by previous circuitry and the amplifier is made to operate in the non-linear portions of the output tubes' transfer curves. When a guitar is used as the signal source to over drive the fixed biased output tubes, an identifiable tonal quality is produced by that fixed bias amplifier.

However, when the output tubes are biased by the method called self bias and the amplifier is over driven by that same guitar signal, a different type of identifiable sound is produced. In this invention, the self biasing mode may be selected by placing the bias type switch 132 into its other position. In this self bias mode, the control grid of the output tube is held at D.C. ground potential and the cathode is connected to the minus side of the B+supply through a relatively large resistor. The function of this resistor has already been described above, but to be clear, this resistor develops the required cathode-grid potential to properly bias the output tube into a useful portion of its transfer characteristic curve. The voltage appearing at the cathode 94 of the output tube 127 is positive in polarity with respect to ground. With the control grid held at D.C. ground, the conditions of proper D.C. bias are achieved as the grid is more negative than the positive cathode. In this self biasing arrangement, the ohmic size of the cathode resistor determines the quiescent current through that output tube.

The following is a description of how this bias mode selector matrix switch works in this invention: The control grid 25 of the output tube 127 goes to point 116 of bias mode selector switch 132 through resistor 66 and potentiometer 74. In this self bias mode, the wiper 137 of the bias switch 132 is connected to pole 119, which is connected to ground (B−). Therefore, the control grid of the output tube 127 is connected to D.C. ground (B−). Also, in the self bias mode the cathode 94 of the output tube 127 is connected to its cathode bias setting resistor 113 through low ohm current sampling resistor 98 (this current sampling resistor is optional, as the invention works perfectly well without it); to points 106 and 107 and then to point 110, which is the wiper connection of the other side of the multi-pole bias type selector switch 132. In this self bias position of switch 132, the wiper 138 of this switch 132 is connected to pole 112 of that same switch 132. From point 112 a higher-ohm resistor 113 is connected to ground (B−). Hence, the cathode 94 of the tube 127 is connected to ground (B−) through its cathode resistor 113, the ohmic size of which will determine the quiescent bias level through the output tube or tubes in being considered. Resistor 113 may be AC bypassed by a capacitor, although it is not necessary for this invention.

Now all conditions have been met to allow the selection of the two different types of output tube biasing modes (fixed and self bias) and to simultaneously select the type of tone the guitar amplifier will produce. As an added optional feature, a resistor 117 has been shown on the lower section of the bias mode selector switch 132 between the wiper output point 116 of that switch 132 and the C− input pole 118 of that switch. The function of this optional resistor is to apply the C− voltage to the control grid 25 of the output tube 127 while the wipers 137 and 138 of that switch 132 are in transitional motion, so as to cushion the transients involved during bias mode switching. The presence of the C− voltage on the control grid of the tube during switch wiper travel minimizes the current increase which would flow through the tube if this precaution were not taken. Any pampering of the output tubes is rewarded by the increased service life which may be achieved through such pampering. This added feature is only optional, and the invention works without it.

The following is a brief description of the remaining components illustrated in FIG. 1: Elements 21–24 are coupling capacitors connected to their respective output tubes. Point 58 is a point in the control grid D.C. feed line for the output tubes and is a common point where the four individual bias set potentiometers connect. Point 58 is the same as point 116. Point 59 is the wiper connection point of individual bias control potentiometer 71 and controls the D.C. bias condition of the control grid of the output tube 129B when the fixed bias mode is selected. When the self bias mode of operation is selected, this potentiometer is part of the grid leak system to common ground. The potentiometer 71 would only appear in the circuit when output tube 129B is present, as in the parallel push pull configuration of output tube topology. Output tube 129B is optional, as are other output tubes in parallel with this vacuum tube. Point 60 is the wiper connection point of individual bias control potentiometer 72 and controls the D.C. condition of the control grid of output tube 129. When the self bias mode of operation is selected, this potentiometer is part of the grid leak system to common ground. Point 61 is the wiper connection point of individual bias control potentiometer 73 and controls the D.C. bias condition of the control grid of the output tube 127B when the fixed bias mode is selected. When the self bias mode of operation is selected, this potentiometer is part of the grid leak system to common ground. The potentiometer 73 would only appear in the circuit when output tube 127B is present, as in the parallel push pull configuration of output tube topology. Output tube 127B is optional, as are other output tubes in parallel with this vacuum tube. Point 62 is the wiper connection point of individual bias control potentiometer 74 and controls the D.C. condition of the control grid of output tube 127. When the self bias mode of operation is selected, this potentiometer is part of the grid leak system to common ground. Element 63 is the control grid bias resistor for output tube 129B and would only appear i the circuit when output tube 129B is present. Element 64 is the control grid bias resistor for output tube 129 and controls the D.C. condition of the control grid of output tube 129. When the self bias mode of operation is selected, this resistor is part of the grid leak system to common ground. Element 65 is the control grid bias resistor for the output tube 127B and would only appear in the circuit when output tube 127B is present. Point 70 is a point in the circuit of the output tube 127 where the D.C. control grid bias and the A.C. drive signal are combined to influence the control grid 25 of that output tube 127. Point 75 is a point in the bias divider chain of the individual bias control potentiometer 71. Point 76 is a point in the bias divider resistor chain of individual bias control potentiometer 72. Point 77 is a point in the bias divider resistor chain of individual bias control potentiometer 73. Point 78 is a point in the bias divider resistor chain of individual bias control potentiometer 74 which controls the C− bias to the output tube 127 and controls the D.C. condition of the control grid of output tube 127 when this invention is in the fixed bias mode. When the self bias mode of operation is selected, this potentiometer is part of the grid leak system to common ground. Element 79 is a resistor in the individual bias control adjustment potentiometer's 71 path of output tube 129B, and is there to prevent the C− bias from being inadvertently adjusted to an incorrect level when this invention is in the fixed bias mode. When this invention is in the self bias mode, this resistor 79 is part of the control grid's 28 leakage path to common ground. Element 80 is a resistor in the individual bias control adjustment potentiometer's 72 path of output tube 129, and is there to prevent the C− bias from being inadvertently adjusted to an incorrect level when this invention is in the fixed bias mode. When this invention is in the self bias mode, this resistor 80, is part of the control grid's 27 leakage path to common ground. Element 81 is a resistor in the individual bias control adjustment potentiometer's 73 path of output tube 127B, and is there to prevent the C− bias from being inadvertently adjusted to an incorrect level when this invention is in the fixed bias mode. When this invention is in the self bias mode, this resistor 81 is part of the control grid's 26 leakage path to common ground. Element 82 is a resistor in the individual bias control adjustment potentiometer's 74 path of output tube 127, and is there to prevent the C− bias from being inadvertently adjusted to an incorrect level when this invention is in the fixed bias mode. When this invention is in the self bias mode resistor 82 is part of the control grid's 25 leakage path to common ground. Element 95 is the cathode element of output tube 127B. Element 96 is the cathode element of output tube 129. Element 97 is the cathode element of output tube 129B. Element 99 is a low ohmage valued resistor, usually between 1 and 10 ohms, (but may be lower or higher in ohmage value), and is employed when a current sampling device is desired for the output tube 127B to monitor that output tube's cathode current. Element 100 is a low ohmage valued resistor, usually between 1 and 10 ohms, (but may be lower or higher in ohmage value) and is employed when a current sampling device is desired for the output tube 129 to monitor that output tube's cathode current. Element 101 is a low ohmage valued resistor, usually between 1 and 10 ohms (but may be lower or higher in ohmage value), and is employed when a current sampling device is desired for the output tube 129B to monitor that output tube's cathode current. Point 102 is the anode (plate) element connection point of the output tube 127. Point 103 is the anode (plate) element connection point of the output tube 127B. Point 104 is the anode (plate) element connection point of the output tube 129. Point 105 is the anode (plate) element connection point of the output tube 129B. Point 106 is a common point where all of the cathode elements of the output tubes tie together. It is connected to points 108 and the wiper 110 of the bias changeover select switch 132. When the parallel push pull configuration of output tubes is employed, 106 also connects to points 107 and 109. Point 107 is a common point where all of the cathode elements of the output tubes tie together. It is connected to points 106 and the wiper 110 of the bias changeover select switch 132. When the parallel push pull configuration of output tubes is employed, 107 also connects to points 108 and 109. Point 108 is a common point where all of the cathode elements of the output tubes tie together. It is connected to points 109 and the wiper 110 of the bias changeover select switch 132. When the parallel push pull configuration of output tubes is employed, 108 also connects to points 106 and 107. Point 109 is a common point where all of the cathode elements of the output tubes tie together. It is connected to points 108 and the wiper 110 of the bias changeover select switch 132. When the parallel push pull configuration of output tubes is employed, 109 also connects to points 106 and 107. Point 123 is a point in the C− supply resistive voltage divider chain and is the junction point of the master C− bias potentiometer 120 and the resistor 124. Element 124 is a resistor in the C− supply voltage divider resistor chain and is present to prevent the C− master adjustment potentiometer 120 from being inadvertently set to a dangerously insufficient level, thereby safeguarding the output devices, when this invention is in the fixed bias mode. In the self bias mode, this resistor performs little function. Tube 129 is an output tube used in the push pull configuration of output tube circuit topology. It would appear in conjunction with the output tube 127. Together, output tubes 127 and 129 comprise a push pull pair where one of the tubes handles essentially one half of the electrical input wave to be amplified, while the other tube handles the other half of the wave, the proportions of which would of course be determined by the quiescent bias on the control grids of the output tubes.

While this invention has been described in connection with preferred embodiments thereof, it is obvious that modifications and changes therein may be made by those skilled in the art to which it pertains without departing from the spirit and scope of the invention. Accordingly, the scope of this invention is to be limited only by the appended claims.

What is claimed as invention is:

1. An output tube bias selection apparatus for tone alteration in a tube-type audio amplifier comprising:

at least one output tube having an output tube control grid and an output tube cathode;

a C− power supply, said C− power supply having a plus side which is grounded;

a B+ power supply, said B+ power supply having a minus side which is grounded; and bias switch means for selectively connecting the output tube control grid through a bias resistor to said C− power supply, and the output tube cathode to ground for fixed bias, or alternatively selectively connecting the output tube control grid to ground through a bias resistor, and the output tube cathode to ground through a resistor for cathode (self) bias.

2. The output tube bias selection apparatus of claim 1 wherein Said bias switch means comprises a double pole, double throw switch having a first set of poles for the control grid connection of the output tube, and a second set of poles for the cathode connection of the output tube.

* * * * *